US007362419B2

(12) United States Patent
Kurihara et al.

(10) Patent No.: US 7,362,419 B2
(45) Date of Patent: Apr. 22, 2008

(54) RANGE IMAGE SENSOR

(75) Inventors: Fumikazu Kurihara, Nara (JP); Yuji Takada, Kyoto (JP); Yusuke Hashimoto, Neyagawa (JP); Fumi Tsunesada, Osaka (JP)

(73) Assignee: Matsushita Electric Works, Ltd., Kadoma-shi (JP)

( * ) Notice: Subject to any disclaimer, the term of this patent is extended or adjusted under 35 U.S.C. 154(b) by 0 days.

(21) Appl. No.: 10/573,573

(22) PCT Filed: Sep. 16, 2005

(86) PCT No.: PCT/JP2005/017569

§ 371 (c)(1),
(2), (4) Date: Mar. 27, 2006

(87) PCT Pub. No.: WO2006/030989

PCT Pub. Date: Mar. 26, 2006

(65) Prior Publication Data

US 2007/0057209 A1 Mar. 15, 2007

(30) Foreign Application Priority Data

Sep. 17, 2004 (JP) ............................ 2004-272000
Sep. 17, 2004 (JP) ............................ 2004-272001

(51) Int. Cl.
*G01C 3/08* (2006.01)

(52) U.S. Cl. .................................... 356/4.07; 356/4.01

(58) Field of Classification Search ...... 356/4.01-4.05, 356/4.07; 382/103-106
See application file for complete search history.

(56) References Cited

U.S. PATENT DOCUMENTS

| | | | | |
|---|---|---|---|---|
| 5,856,667 | A | 1/1999 | Spirig et al. | |
| 6,373,557 | B1 | 4/2002 | Mengel et al. | |
| 6,639,656 | B2 * | 10/2003 | Takada et al. | 356/4.01 |
| 6,771,312 | B2 * | 8/2004 | Kamishima et al. | 348/229.1 |
| 6,810,207 | B2 * | 10/2004 | Sato et al. | 396/54 |

(Continued)

FOREIGN PATENT DOCUMENTS

JP 9-257418 10/1997

(Continued)

OTHER PUBLICATIONS

Full English translation of JP 2000-105111 document, by FLS Translations, Inc., Jul. 2007, pp 1-51.*

(Continued)

*Primary Examiner*—Isam Alsomiri
(74) *Attorney, Agent, or Firm*—Edwards Angell Palmer & Dodge LLP

(57) ABSTRACT

A range image sensor comprising a light source, a light detecting element, a sensor control stage and an image construction stage. The image construction stage calculates a distance value for each image element in a range image based on each electric charge picked up after a specific detection period of different detection periods by the sensor control stage, and then constructs the range image. The specific detection period is one of one or more detection periods during which the light detecting element does not reach saturation, and is one detection period during which a value related to the quantity of light received from the object space becomes maximum of that of the one or more detection periods.

15 Claims, 10 Drawing Sheets

U.S. PATENT DOCUMENTS

| | | | | |
|---|---|---|---|---|
| 7,138,646 | B2 * | 11/2006 | Hashimoto et al. .... | 250/559.38 |

FOREIGN PATENT DOCUMENTS

| | | |
|---|---|---|
| JP | 10-508736 | 8/1998 |
| JP | 2000-105111 | 4/2000 |
| JP | 2000-517427 | 12/2000 |
| JP | 2002-516490 | 6/2002 |
| JP | 2003-532122 | 10/2003 |
| JP | 2004-032682 | 1/2004 |
| JP | 2004-045304 | 2/2004 |
| JP | 2004-525351 | 8/2004 |
| JP | 2004-272001 | 9/2004 |
| JP | 2004-309310 | 11/2004 |
| JP | 2004-356594 | 12/2004 |
| JP | 2006-084429 | 3/2006 |
| JP | 2006-084430 | 3/2006 |

OTHER PUBLICATIONS

Two Examination Reports and English Translations dated Oct. 3, 2006.

* cited by examiner

RANGE IMAGE SENSOR

TECHNICAL FIELD

The invention relates a range image sensor for capturing an image of an object space to generate a range image in which each image element includes, when at least a physical object is in the object space, a corresponding distance value up to the physical object.

BACKGROUND ART

A displacement measuring device described Japanese Laid-open Patent Publication No. H09-267418 scans a light beam irradiated to an object to be measured and then measures a distance up to a displacement surface of the object with respect to a reference surface of the object based on triangulation.

However, the device is not suitable for such purposes as, for example, tracing the locus of motion of a physical object in an object space. Because it is necessary to scan the whole object space with the beam in order to trace the locus and comparative long time is taken until the device finishes scanning the whole object space with the beam.

This problem can be solved by a range image sensor according to our another invention (cf. Japanese Patent Publication No. 2004-272001). The sensor comprises a light source which emits intensity modulated light toward an object space and a light detecting element with a photosensitive array disposed to face the object space. While the intensity modulated light is emitted toward the object space, a range image is constructed based on the output of the light detecting element. When at least a physical object is in the object space, each image element in the range image has a corresponding distance value up to the physical object. Each distance value is obtained from a difference between the phase of the light emitted from the light source and the phase of the light received by a corresponding pixel of the light detecting element. A period of time (hereinafter referred to as an "integration period") during which each pixel mainly integrates an electric charge in response to the light is set to a shorter time than one period of the intensity modulated light.

If the integration period is comparative long time, it is possible to reduce shot noise occurred at the photosensitive array to raise the S/N ratio. But, the light detecting element becomes easy to be saturated under circumstances which includes a lot of ambient light noise (e.g., solar radiation). On the other hand, if the integration period is comparative short time, the light detecting element becomes hard to be saturated. However, the S/N ratio falls and it is difficult to obtain correct distance.

DISCLOSURE OF THE INVENTION

It is therefore an object of the present invention to raise accuracy of distance measurement by raising the S/N ratio while preventing saturation of the light detecting element.

A range image sensor of the present invention comprises a light source, a light detecting element, a sensor control stage and an image construction stage. The light source emits intensity modulated light toward an object space according to a modulation signal of a specific frequency. The light detecting element has photosensitive units disposed to face the object space. Each of the photosensitive units receives light from the object space during an integration period shorter than one period of the specific frequency, and generates an electric charge in response to a quantity of light from the space. The sensor control stage controls to synchronize each integration period of the photosensitive units with a specific phase of the modulation signal. After a detection period corresponding to one or more periods of the specific frequency, the sensor control stage also controls to pick up each electric charge generated and integrated in the light detecting element from the light detecting element. The image construction stage calculates a distance value for each image element in a range image based on each electric charge picked up by the sensor control stage, and then constructs the range image. When at least a physical object is in the object space, the distance value represents distance up to the physical object. The detection period includes different detection periods. The image construction stage calculates a distance value for each image element in the range image based on each electric charge picked up after a specific detection period of the different detection periods by the sensor control stage. The specific detection period is one of one or more detection periods during which the light detecting element does not reach saturation, and is one detection period during which a value related to the quantity of light received from the object space becomes maximum of that of the one or more detection periods.

In this configuration, since a distance value for each image element in the range image is calculated based on each electric charge picked up in synchronization with the specific detection period and then the range image is constructed, it is possible to raise the S/N ratio while preventing saturation of the light detecting element and raise accuracy of distance measurement.

In a preferred embodiment, the sensor control stage controls to synchronize each integration period of the photosensitive units with each of a set of phases different from each other in the modulation signal. The sensor control stage also controls to pick up one set of electric charges corresponding to the one set of phases at every image element in the range image after at least the specific detection period of the different detection periods. The image construction stage calculates a distance value for each image element in the range image based on one set of electric charges picked up at every image element in the range image after the specific detection period. In this configuration, a distance value can be calculated based on one set of electric charges corresponding to the one set of phases.

In an enhanced embodiment, the sensor control stage controls to pick up one set of electric charges corresponding to the one set of phases at every image element in the range image after each of the different detection periods. The image construction stage selects the specific detection period out of the different detection periods. The image construction stage also calculates a distance value for each image element in the range image based on one set of electric charges picked up at every image element in the range image after the specific detection period. The specific detection period is one of one or more detection periods during which a value obtained from one set of electric charges picked up at every image element in the range image after each of the different detection periods does not exceed a value predetermined based on saturation level of the light detecting element, and is one detection period during which the value obtained from one set of electric charges becomes maximum of that of the one or more detection periods. According to this invention, it is possible to raise the S/N ratio while preventing the saturation of the light detecting element and raise the accuracy of distance measurement.

In an alternate embodiment, the specific detection period is one of one or more detection periods during which a value of one set of electric charges picked up at every image element in the range image after each of the different detection periods does not exceed a prescribed value corresponding to the saturation level, and is one detection period during which the value of one set of electric charges becomes maximum of that of the one or more detection periods. According to this invention, it is possible to raise the S/N ratio while preventing the saturation of the light detecting element and raise the accuracy of distance measurement.

In another alternate embodiment, the specific detection period is one of one or more detection periods during which a value of maximum electric charge for each of one set of electric charges picked up at every image element in the range image after each of the different detection periods does not exceed a maximum threshold value predetermined based on the saturation level, and is one detection period during which the value of maximum electric charge becomes maximum of that of the one or more detection periods. According to this invention, it is possible to raise the S/N ratio while preventing the saturation of the light detecting element and raise the accuracy of distance measurement.

In other alternate embodiment, the specific detection period is one of one or more detection periods during which a mean value with respect to one set of electric charges picked up at every image element in the range image after each of the different detection periods does not exceed an average reference value predetermined based on the saturation level, and is one detection period during which the mean value becomes maximum of that of the one or more detection periods. In this configuration, it is possible to consider intensity modulated light from the object space and ambient light component to distinguish whether or not the light detection element is saturated.

In another enhanced embodiment, when the specific detection period is not selected or a first specific detection period as the specific detection period is shorter than prescribed length, the image construction stage selects a second specific detection period out of the different detection periods at every one or more phases of the one set of phases with respect to a specific image element for which the specific detection period is not selected or the first specific detection period shorter than the prescribed length is selected. The image construction stage then corrects one or more values obtained from one set of electric charges picked up with respect to the specific image element after the second specific detection period based on a rate of length of the corresponding second specific detection period. The image construction stage then calculates one set of values and calculates a distance value for the specific image element based on the one set of values. The second specific detection period is one of one or more detection periods during which a value obtained from electric charge corresponding to the one or more phases of the one set of phases does not exceed a value predetermined based on the saturation level, and is one detection period during which the value obtained from electric charge becomes maximum of that of the one or more detection periods. In this configuration, there is a possibility of which the distance value can be calculated even when the first specific detection period is not selected. Also, when the first specific detection period is shorter than the prescribed length, it is possible to utilize a value of available electric charge obtained during the detection period longer than the first specific detection period. As a result, it is possible to suppress influence of the shot noise to improve the measurement accuracy.

In another enhanced embodiment, the image construction stage calculates a comparison value by applying at least a value obtained from one set of electric charges picked up by the sensor control stage to a function with respect to the quantity of light received by each of the photosensitive units. The image construction stage then compares the comparison value with a prescribed threshold value to select the specific detection period. In this configuration, for example, if the comparison value is smaller than the prescribed threshold value, a long detection period can be selected as the specific detection period out of the different detection periods. Also if the comparison value is larger than the prescribed threshold value, a short detection period can be selected as the specific detection period out of the different detection periods.

In an alternate embodiment, the comparison value is a mean value with respect to each electric charge corresponding to each quantity of light received by each of the photosensitive units during one or plural periods of the specific frequency. In this configuration, it is possible to consider intensity modulated light from the object space and ambient light component to distinguish whether or not the light detecting element is saturated.

In another enhanced embodiment, when a distance value for a specific image element in the range image is not calculated, the image construction stage allocates an alternate value to the specific image element. In this configuration, when the specific detection period cannot be selected out of the different detection periods with respect to the specific image element, it is possible to construct a range image without an error value by allocating the alternate value to the specific image element.

In an alternate embodiment, the alternate value is a past distance value for the specific image element. In this configuration, if the range image sensor is located in environment in which change of distance is comparatively few, a proper distance value can be allocated to the specific image element.

In another alternate embodiment, the alternate value is a mean value with respect to a distance value of each image element around the specific image element. In this configuration, a proper distance value with continuity can be allocated to the specific image element.

In other enhanced embodiment, the image construction stage calculates one set of integrating electric charges at every image element in the range image and calculates a distance value for each image element in the range image based on each one set of integrating electric charges. The one set of integrating electric charges is obtained that each electric charge in a plurality of the specific detection periods is added up at every same phase of said one set of phases. In this configuration, since it is possible to comparatively reduce the quantity of light received in each specific detection period, saturation of the light detecting element can be prevented.

In other enhanced embodiment, the light detecting element includes pixels each of which is consisted of two or more neighboring photosensitive units in the photosensitive units. Each of the pixels mainly generates and integrates two or more electric charges at its two or more neighboring photosensitive units in synchronization with two or more phases of each group obtained by dividing the one set of phases into groups each of which includes two or more phases, respectively. The sensor control stage controls to change synchronization timing of each integration period of two or more neighboring photosensitive units in each of the pixels with respect to each phase of a corresponding group of the groups so as to mutually interchange each phase of the corresponding group with respect to the neighboring photosensitive units. The sensor control stage also controls to pick up each electric charge mainly generated and integrated during each integration period corresponding to each phase of the each group at every pixel after at least the specific detection period of the different detection periods. The image construction stage combines each electric charge picked up at every pixel by the sensor control stage with one set of electric charges corresponding to the one set of phases. The image construction stage then calculates a distance value for each image element in the range image based on the one set of electric charges. In this configuration, it is possible to secure reliability of distance value obtained from each pixel consisted of the neighboring photosensitive units, since it is possible to almost remove error caused by difference of each position of the neighboring photosensitive units.

In other enhanced embodiment, a plurality of neighboring photosensitive units are set as a unit of arithmetic. The sensor control stage changes an integration period of each photosensitive unit of the unit of arithmetic to an integration period of a different phase of the one set of phases at every specific detection period. The image construction stage makes a value of an image element in the range image out of distance found by using an electric charge added up a period of time in which each photosensitive unit receives light from the object space. The light is received same number of times each in all integration periods of the phase. In this configuration, when a different photosensitive unit receives light during an integration period in synchronization with a different phase of the modulation signal in a specific detection period, position information of the plurality of photosensitive units of the unit of arithmetic is not included in an electric charge added up in order to find the distance. Therefore, reliability of the obtained distance becomes high.

BRIEF DESCRIPTION OF THE DRAWINGS

Preferred embodiments of the invention will now be described in further details. Other features and advantages of the present invention will become better understood with regard to the following detailed description and accompanying drawings wherein.

BEST MODE FOR CARRYING OUT THE INVENTION

Figure 1:
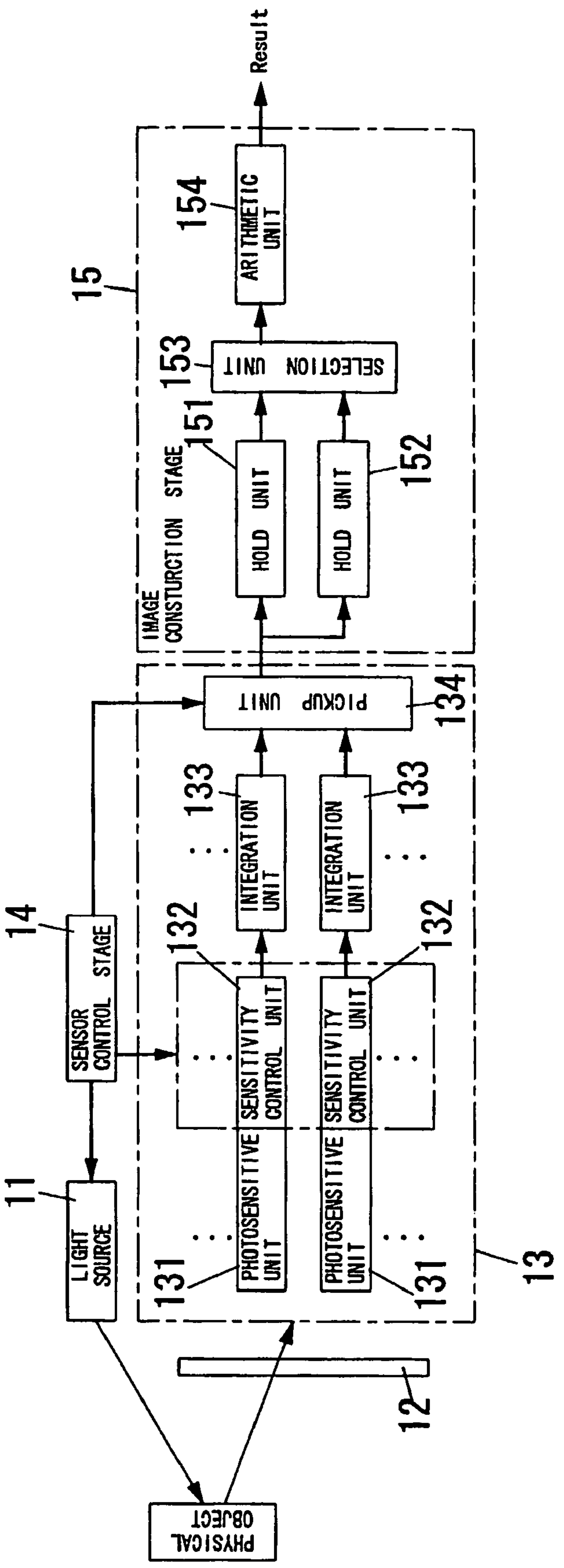
FIG. 1 is a block diagram of a range image sensor of a first embodiment according to the present invention.

FIG. 1 shows a range image sensor of a first embodiment according to the present invention. The sensor comprises a light source 11, an optical system 12, a light detecting element 13, a sensor control stage 14 and an image construction stage 15.

Figure 2:
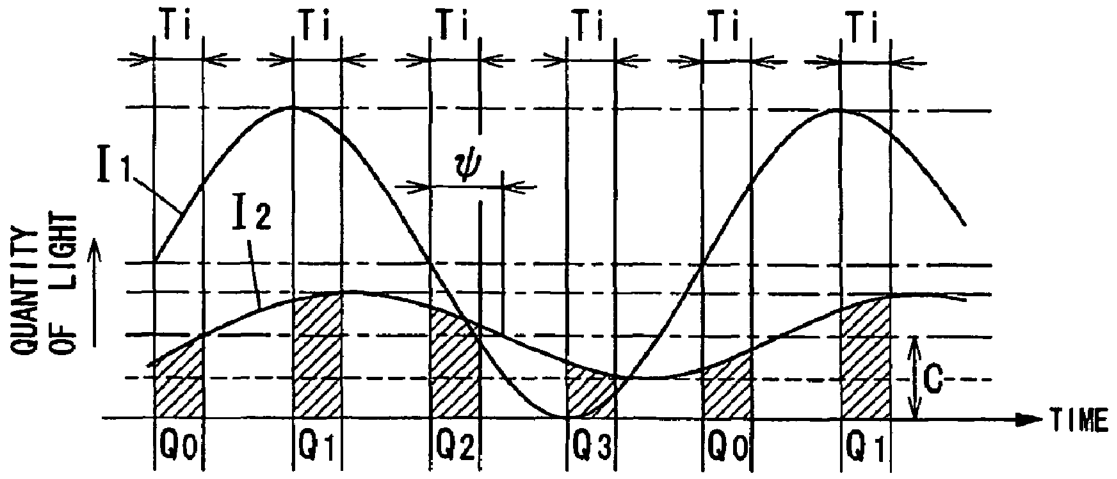
FIG. 2 shows operation of the range image sensor of the first embodiment.

The light source 11 is constructed with, for example, a LED array arranged on a plane, a semiconductor laser and a divergent lens, or the like, in order to provide enough intensity of light. The source 11 as shown in FIG. 2 modulates intensity $I_1$ of light according to a modulation signal of a specific frequency from the sensor control stage 14 to emit sinusoidal intensity-modulated light toward an object space. However, not limited to this, intensity waveform of the intensity modulated light may be a shape such as a triangular wave, saw tooth wave or the like. Also, the source 11 may comprise an infrared LED array, an infrared semiconductor laser and a divergent lens, or the like.

The optical system 12 is a receiving optical system constructed with, for example a lens and so on, and condenses light from the object space into a receiving surface (each photosensitive unit 131) of the light detecting element 13. For example, the system 12 is disposed so as to orthogonalize its optical axis and the receiving surface of the element 13. However, the system 12 may comprise a lens, an infrared transmission filter and so on.

The light detecting element 13 is formed in a semiconductor device and includes photosensitive units (each of which is denoted by 131), sensitivity control units (132), integration units (133) and a pickup unit 134. Each photosensitive unit 131, each sensitivity control unit 132 and each integration unit 133 constitute a two-dimensional photosensitive array disposed to face the object space through the optical system 12.

Figure 3A:
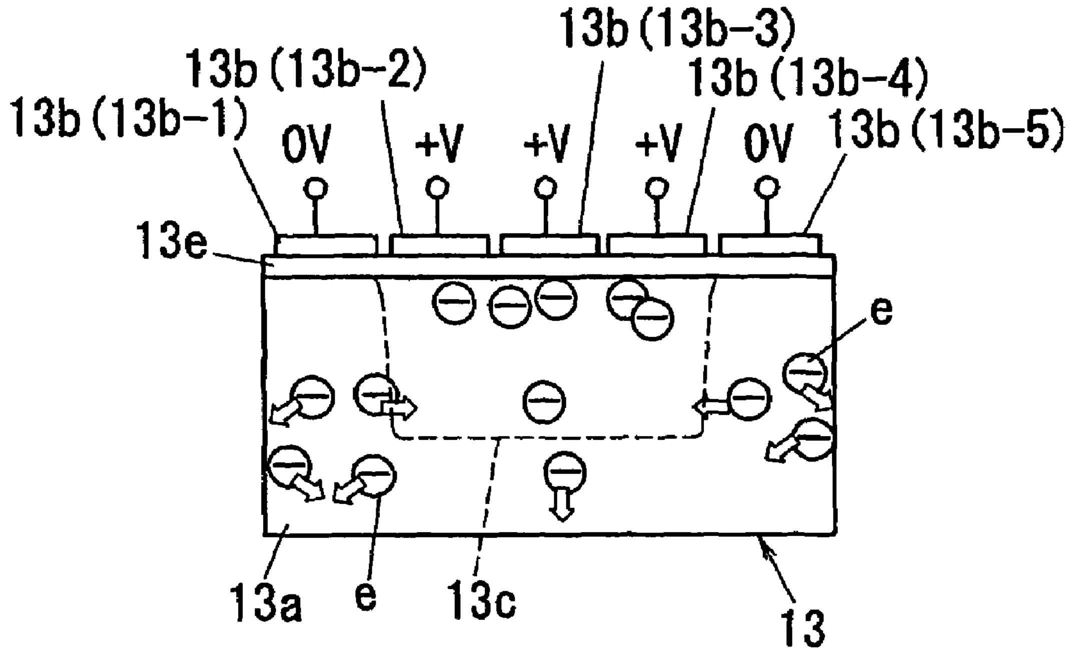
FIG. 3A shows a region corresponding to one photosensitive unit in the range image sensor of the first embodiment.
Figure 3B:
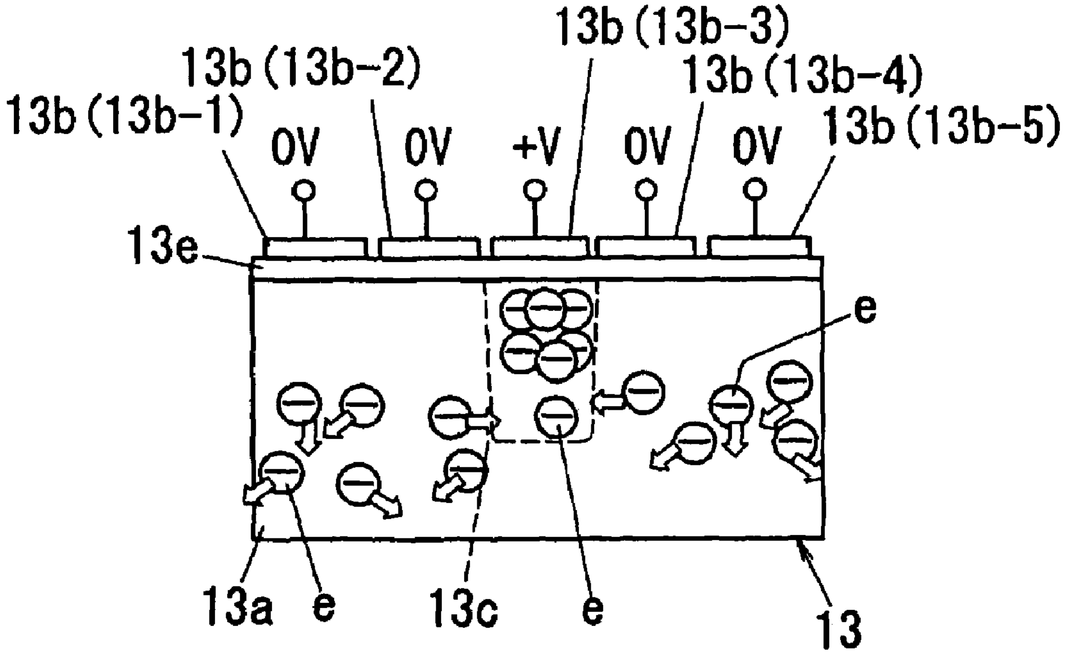
FIG. 3B shows the region corresponding to the photosensitive unit.

Each photosensitive unit 131 as shown in FIGS. 3A and 3B is formed as a photosensitive element of, for example, a 100×100 photosensitive array by an impurity doped semiconductor layer 13*a* in a semiconductor substrate. The unit 131 generates an electric charge of quantity in response to a quantity of light from the object space at the photosensitivity-sensitivity controlled by a corresponding sensitivity control unit 132. For example, the semiconductor layer 13*a* is n-type and the generated electric charge is derived from electrons.

When the optical axis of the optical system 12 is at right angles to the receiving surface, it is possible to regard the optical axis and both axes of vertical (length) direction and horizontal (breadth) direction of the receiving surface as three axes of an orthogonal coordinates system. Also, the center of the system 12 is regarded as the origin of the orthogonal coordinates system. In this case, each photosensitive unit 131 generates an electric charge of quantity in response to a quantity of light from direction indicated by angles of azimuth and elevation. When at least a physical object is in the object space, the light emitted from the light source 11 is reflected at the physical object and then received by each unit 131. Therefore, the unit 131 as shown in FIG. 2 receives the intensity modulated light delayed by the phase Ψ corresponding to the output and return distance up to the physical object and then generates an electric charge of quantity in response to its intensity $I_2$. The intensity modulated light is represented by $$I_2 \cdot \sin(\omega t - \Psi) + C, \quad (1)$$

where ω is an angular frequency and C is a value obtained by adding a mean value of intensity $I_2$ to a value of ambient light component.

The sensitivity control unit 132 is constructed with control electrodes (13*b*) layered on a surface of the semiconductor layer 13*a* through an insulation film (oxide film) 13*e*. The unit 132 controls the sensitivity of a corresponding photosensitive unit 131 according to a sensitivity control signal from the sensor control stage 14. For example, as shown in FIGS. 3A and 3B, the unit 132 is constructed with five control electrodes 13*b*-1, 13*b*-2, 13*b*-3, 13*b*-4 and 13*b*-5. Each electrode is applied with voltage (+V, 0V) as the sensitivity control signal when the generated electric charge is derived from, for example, electrons. The +V is a predetermined positive voltage. The width size of the electrode 13*b* in right and left direction is set to approximately 1 μm. The electrode 13*b* and the film 13*e* are formed of material with translucency with respect to the light of the light source 11.

The integration unit 133 is comprised of a potential well (depletion layer) 13*c* which changes in response to the sensitivity control signal applied to corresponding each control electrode 13*b*. The unit 133 captures and integrates electrons (e) in proximity to the well 13*c*. Electrons not integrated in the unit 133 disappear by recombination with holes. Therefore, it is possible to control the photosensitivity-sensitivity of the light detecting element 13 by changing the size of region of the well 13*c* with the sensitivity control signal. For example, the sensitivity in a state of FIG. 3A is higher than that in a state of FIG. 3B.

Figure 4:
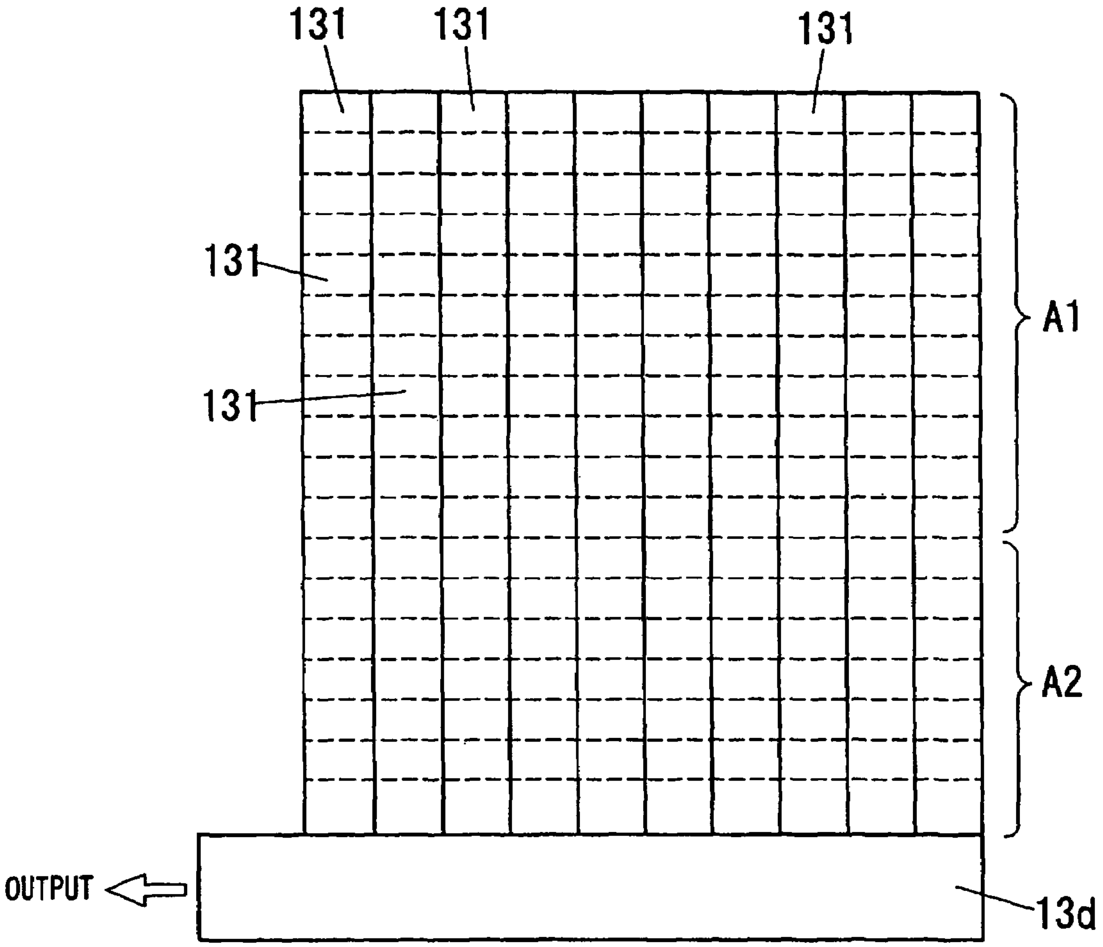
FIG. 4 is a schematic diagram of a pickup unit in the range image sensor of the first embodiment.

The pickup unit 134, for example, as shown in FIG. 4 has similar construction to a CCD image sensor of frame transfer (FT) type. In an image pick up region A1 constructed with the photosensitive units and a light-shielded storage region A2 next to the region A1, a semiconductor layer 13*a* continuing as one in each vertical (length) direction is used as a transfer path of each electric charge along the vertical direction. The vertical direction corresponds to the right and left direction of FIGS. 3A and 3B.

The pickup unit 134 is constructed with the storage region A2, each transfer path, and a horizontal transfer register 13*d* which is a CCD and receives an electric charge from one end of each transfer path to transfer each electric charge along horizontal direction. Transfer of each electric charge from the image pick up region A1 to the region A2 is executed at one time during a vertical blanking period. Namely, after each electric charge is integrated in each potential well 13*c*, a voltage pattern different from a voltage pattern of the sensitivity control signal is applied to each control electrode 13*b* as a vertical transfer signal. Accordingly, each electric charge integrated in each well 13*c* is transferred along the vertical direction. As to transfer from the horizontal transfer register 13*d* to the image construction stage 15, a horizontal transfer signal is supplied to the register 13*d* and each electric charge of one horizontal line is transferred during a horizontal period. However, the horizontal transfer register may transfer each electric charge along normal direction to the plane of FIGS. 3A and 3B.

The sensor control stage 14 is an operation timing control circuit and controls operation timing of the light source 11, each sensitivity control unit 132 and the pickup unit 134. Namely, the stage 14 provides the source 11 with the modulation signal of the specific frequency (e.g., 20MHz) to control change timing of the intensity of the intensity modulated light. Because transmission time of light for the abovementioned out and return distance is extremely short time, i.e., nanosecond level.

The sensor control stage 14 also controls to synchronize an integration period of each photosensitive unit 131 with a specific phase (e.g., each of one set of phases different from each other) of the modulation signal. In the first embodiment, the stage 14 as shown in FIGS. 2 and 3A applies the voltage +V and the voltage 0V to the control electrodes 13*b*-2 to 13*b*-4 and the electrodes 13*b*-1 and 13*b*-5, respectively so as to synchronize start time of integration period Ti of each unit 131 with a phase angle of 0, 90, 180 to 270 degrees of the modulation signal (cf., $I_1$). Accordingly, the sensitivity of each unit 131 is changed to a high sensitivity during the integration period shorter than one period of the specific frequency. Also, the stage 14 as shown in FIG. 3B applies the voltage +V and the voltage 0V to the electrode 13*b*-3 and the electrodes 13*b*-1, 13*b*-2, 13*b*-4 and 13*b*-5, respectively in synchronization with a storage period which is a remaining period of said one period except the integration period. Accordingly, the sensitivity of each unit 131 is changed to a low sensitivity during the storing period. Therefore, in the element 13, part of electric charge generated by the unit 131 is integrated by the integration unit 133 (potential well 13*c*) on the high sensitivity, and then stored by the unit 133 on the low sensitivity.

The sensor control stage 14 further controls to pick up each electric charge generated and stored in the light detecting element 13 from the element 13 in synchronization with a detection period corresponding to one or more periods of the specific frequency. Namely, the stage 14 supplies the vertical transfer signal to each control electrode 13*b* during the vertical blanking period and also supplies the horizontal transfer signal to the horizontal transfer register 13*d* during the horizontal period. For example, each electric charge generated and stored in the element 13 is picked up during a pickup period (see $T_{R1}$ to $T_{R4}$ in FIG. 7) in synchronization with end time of a detection period.

The image construction stage 15 is constructed with, for example, a CPU, a storage device for storing a program and so on, etc. The stage 15 calculates a distance value for each image element in a range image based on each electric charge picked up by the sensor control stage 14. When at least a physical object is in the object space, the distance value represents distance up to the physical object. The stage 14 then constructs the range image with a distance value for each image element.

Principle of calculation of the distance value is explained. The phase (phase difference) Ψ of FIG. 2 corresponds to out and return distance between the receiving surface of the light detection element 13 and the physical object in the object space. Therefore, by calculating the phase Ψ, it is possible to calculate distance up to the physical object. The phase Ψ and reflectance of the physical object seldom change in a period of time for integrating and picking up one set of electric charges. In this case, the phase Ψ can be calculated from time integration values (e.g., Ti integration values $Q_0$, $Q_1$, $Q_2$ and $Q_3$) of a curve indicated by Eq. (1). Instantaneous values $q_0$, $q_1$, $q_2$ and $q_3$ of the time integration values (quantities of light received) $Q_0$, $Q_1$, $Q_2$ and $Q_3$ are respectively given by $$q_0 = I_2 \cdot \sin(-\psi) + C = -I_2 \cdot \sin(\psi) + C,$$

$$q_1 = 12 \cdot \sin(\pi/2 - \psi) + C = -I_2 \cdot \cos(\psi) + C,$$

$$q_2 = I_2 \cdot \sin(\Pi - \psi) + C = I2 \cdot \sin(\psi) + C,$$

and $$q_3 = I_2 \cdot \sin(3\Pi/2 - \psi) + C = -I_2 \cdot \cos(\psi) + C.$$

Therefore, the phase $\Psi$ is given by the following Eq. (2), and also in case of the time integration values it is possible to obtain the phase $\Psi$ by Eq. (2).

$$\Psi = \tan^{-1}\{(q_2 - q_0)/(q_1 - q_3)\} \quad (2)$$

However, when the intensity modulated light is represented by $I_2 \cdot \cos(\omega t - \Psi) + C$, the phase $\Psi$can be given by $\Psi = \tan^{-1}\{(q_1 - q_3)/(q_0 \cdot q_2)\}$. When a sign of the phase $\Psi$ is minus, order of each term of a denominator and a numerator in $\tan^{-1}\{\ldots\}$ may be interchanged each other or an absolute value may be used.

In case the photosensitive unit 131 generates an electric charge in proportion to the quantity of light received, when the integration unit 133 integrates an electric charge corresponding to $Q_0$, the electric charge proportional to $\alpha Q_0 + \beta (Q_1 + Q_2 + Q_3) + \beta Q_X$ is integrated. The $\alpha$ is a sensitivity in each integration period Ti corresponding to $Q_0$ to $Q_3$ to $\beta$ is a sensitivity in the storing period, and the $Q_X$ is a quantity of light received in the storing period. When the unit 131 also integrates an electric charge corresponding to $Q_2$, the electric charge proportional to $\alpha Q_2 + \beta (Q_0 + Q_1 + Q_2) + \beta Q_X$ is integrated. Owing to $Q_2 \cdot Q_0 = (\alpha \cdot \beta)(Q_2 \cdot Q_0)$ and $Q_1 - Q_3 = (\alpha \cdot \beta)(Q_1 \cdot Q_3)/(Q_2 \cdot Q_0)/(Q_1 \cdot Q_3)$ does not change in theory regardless of whether or not an unwanted electric charge is mixed in the integration unit (cf. Eq. (2)). Therefore, even if an unwanted electric charge is mixed in the integration unit, a phase $\Psi$ for a corresponding image element does not change.

In the first embodiment, the detection period includes different detection periods. The different detection periods are, for example, a long detection period and a short detection period shorter than the long detection period. The short detection period is set to a period of time corresponding to one or more periods of the specific frequency. Also, each pixel in the image pick up region A1 consists of, for example, four neighboring photosensitive units. And, the sensor control stage 14 controls to pick up one set of electric charges corresponding to the one set of phases at every pixel of the light detecting element (image pick up region A1) in synchronization with each of the different detection periods. However, not limited to this, each pixel may consist of one photosensitive unit and the sensor control stage may control to respectively pick up on set of electric charges corresponding to the one set of phases at every pixel in synchronization with at least four detection periods.

The image construction stage 15 selects a specific detection period out of the different detection periods. The stage 15 then calculates a distance value for each image element in the range image based on one set of electric charges picked up at every pixel in synchronization with the specific detection period. The specific detection period is one of one or more detection periods during which the light detecting element 13 does not reach saturation and is one detection period during which a value related to the quantity of light received from the object space becomes maximum of that of the one or more detection periods. The value related to the quantity of light received is, for example, a value obtained from one set of electric charges.

On account of this, the image construction stage 15 is constructed with hold units 151 and 152, a selection unit 153 and an arithmetic unit 154. The units 151 and 152 are constructed with a memory for storing each digital value obtained by A/D converting each electric charge (analog signal). The unit 151 temporally holds one set of electric charges (digital values) picked up at every pixel in synchronization with the long detection period by the sensor control stage 14. The unit 152 temporally holds one set of electric charges (digital values) picked up at every pixel in synchronization with the short detection period by the stage 14.

The selection unit 153 selects the specific detection period out of the long detection period and the short detection period at every one set of electric charges (digital values) in each of the hold units 151 and 152. If a value of one set of electric charges obtained from the unit 151 does not exceed a prescribed value corresponding to saturation level of the light detecting element 13, the long detection period corresponding to the unit 151 is selected as the specific detection period. If the value of one set of electric charges exceeds the prescribed value, the long between period is not selected. In this case, if a value of one corresponding set of electric charges obtained from the unit 152 does not exceed the prescribed value, the short detection period corresponding to the unit 152 is selected as the specific detection period.

Whenever the specific detection period is selected, the arithmetic unit 154, based on one set of electric charges (digital values) corresponding to the specific detection period, calculates a distance value for an image element corresponding to the pixel from which the one set of electric charges has been picked up.

The operation of the first embodiment is now explained. The sensor control stage 14 controls the sensitivity of the light detecting element 13 to integrate an electric charge generated at each photosensitive unit 131 during each of the different detection periods into its integration unit 133. For example, when an electric charge corresponding to the time integration value (quantity of light received) $Q_0$ is integrated into an unit 133, the stage 14 raises the sensitivity of the unit 133 during the integration period Ti corresponding to $Q_0$. The stage 14 also lowers the sensitivity of the unit 133 during all (storing period) but the period Ti. Accordingly, it is possible to integrate and store the electric charge corresponding to $Q_0$ into the unit 133. Similarly, it is possible to integrate and store an electric charge corresponding to each time integration value into each unit 133. Also, a ratio of signal electric charge (electric charge corresponding to the intensity modulated light) to noise electric charge (electric charge corresponding to ambient light component and shot noise generated inside the element 13) can be made larger. Therefore, a large S/N ratio is obtained.

In order to pick up an electric charge integrated into each integration unit 133, the sensor control stage 14 supplies the vertical transfer signal to each control electrode 13*b* during the vertical blanking period after the long detection period or the short detection period. The stage 14 also supplies the horizontal transfer signal to the horizontal transfer register 13*d* during the horizontal period. Accordingly, each electric charge integrated and stored during the long detection period is held by the hold unit 151. Also, each electric charge integrated and stored during the short detection period is held by the hold unit 152.

The selection unit 153 selects the specific detection period out of the long detection period and the short detection period at every one set of the electric charges in each of the units 151 and 152. Whenever the specific detection period is selected, the arithmetic unit 154, based on one set of electric charges for each pixel corresponding to the specific detection period, calculates a distance value for each pixel. Then, a range image is constructed.

Figure 5A:
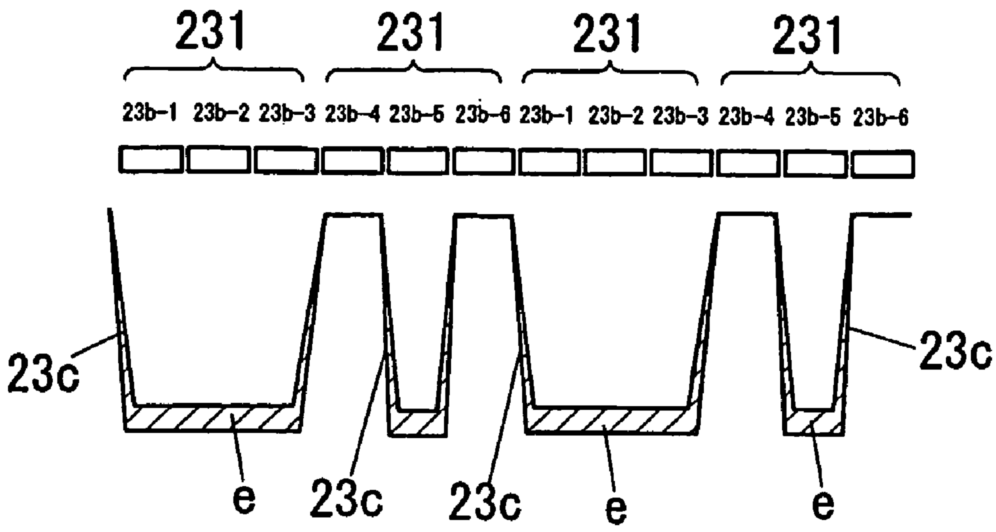
FIG. 5A shows operation of a range image sensor of a second embodiment according to the present invention.
Figure 5B:
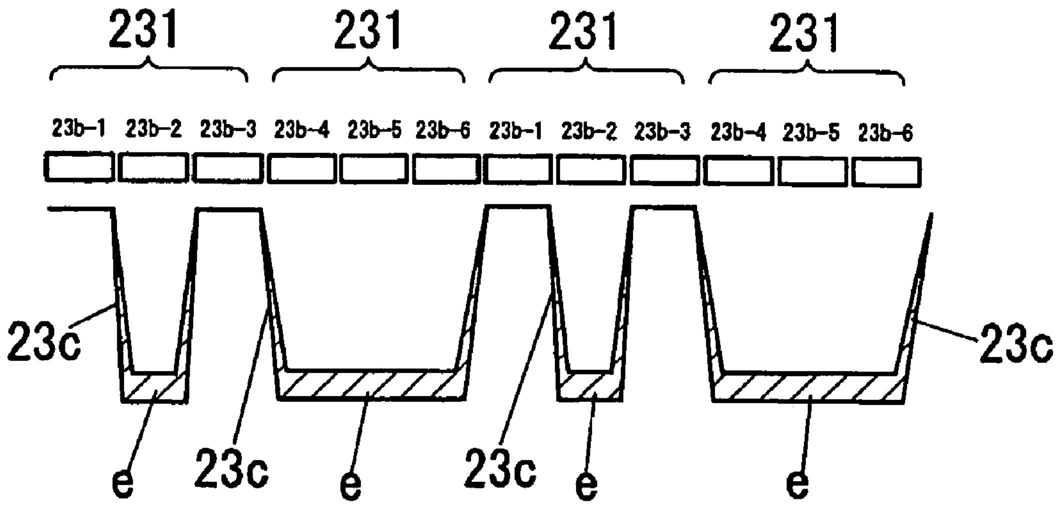
FIG. 5B shows another operation of the range image sensor of the second embodiment.

FIGS. 5A and 5B show operation of a range image sensor of a second embodiment according to the present invention. In the range image sensor of the second embodiment, two neighboring photosensitive units 231 and 231 along the vertical direction are used as one pixel. Also, overflow drain is provided at every pixel.

If a photosensitive unit generates the electric charges corresponding to $Q_0$–$Q_3$, resolution with respect to line-of-sight direction becomes high. But the problem of time difference is occurred because at least the specific detection period is required for each of electric charges corresponding to $Q_0$–$Q_3$. Inversely, if four photosensitive units respectively generate the electric charges corresponding to $Q_0$–$Q_3$, it is possible to pick up the electric charges corresponding to $Q_0$–$Q_3$ in synchronization with at least the specific detection period and therefore the time difference become small. However, the resolution with respect to line-of-sight direction becomes low.

In the second embodiment as shown in FIGS. 5A and 5B, two photosensitive units 231 and 231 are utilized for one pixel in order to solve the problem. In FIGS. 3A and 3B of the first embodiment, while an electric charge is generated at the photosensitive unit 131, two control electrodes 13*b*-1 and 13*b*-5 at both sides has function that forms potential barrier for preventing part of the electric charge from flowering in each neighboring photosensitive unit 131. In the second embodiment, since any photosensitive unit 231 forms the barrier between potential wells 23*c* and 23*c* of the neighboring photosensitive units 231 and 231, three control electrodes are provided with respect to each photosensitive unit 231. Therefore, six control electrodes 23*b*-1, 23*b*-2, 23*b*-3, 23*b*-4, 23*b*-5 and 23*b*-6 are provided with respect to each pixel.

Figure 7:
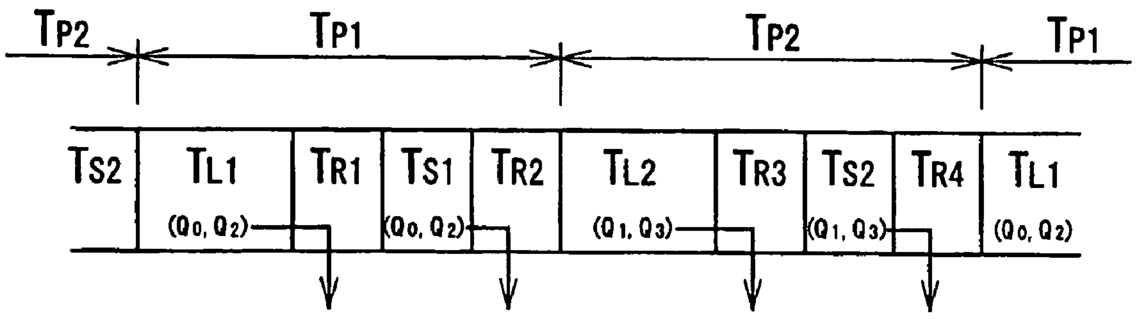
FIG. 7 shows operation of the range image sensor of the second embodiment.

The sensor control stage of the second embodiment controls to pick up one set of electric charges corresponding to the one set of phase of the modulation signal at every image element in the range image in synchronization with each of the different detection periods. Synchronization with each of the different detection periods as shown in FIG. 7 is executed in order of a long detection period $T_{L1}$, a short detection period $T_{S1}$, a long detection period $T_{L2}$ and a short detection period $T_{S2}$.

Figure 6:
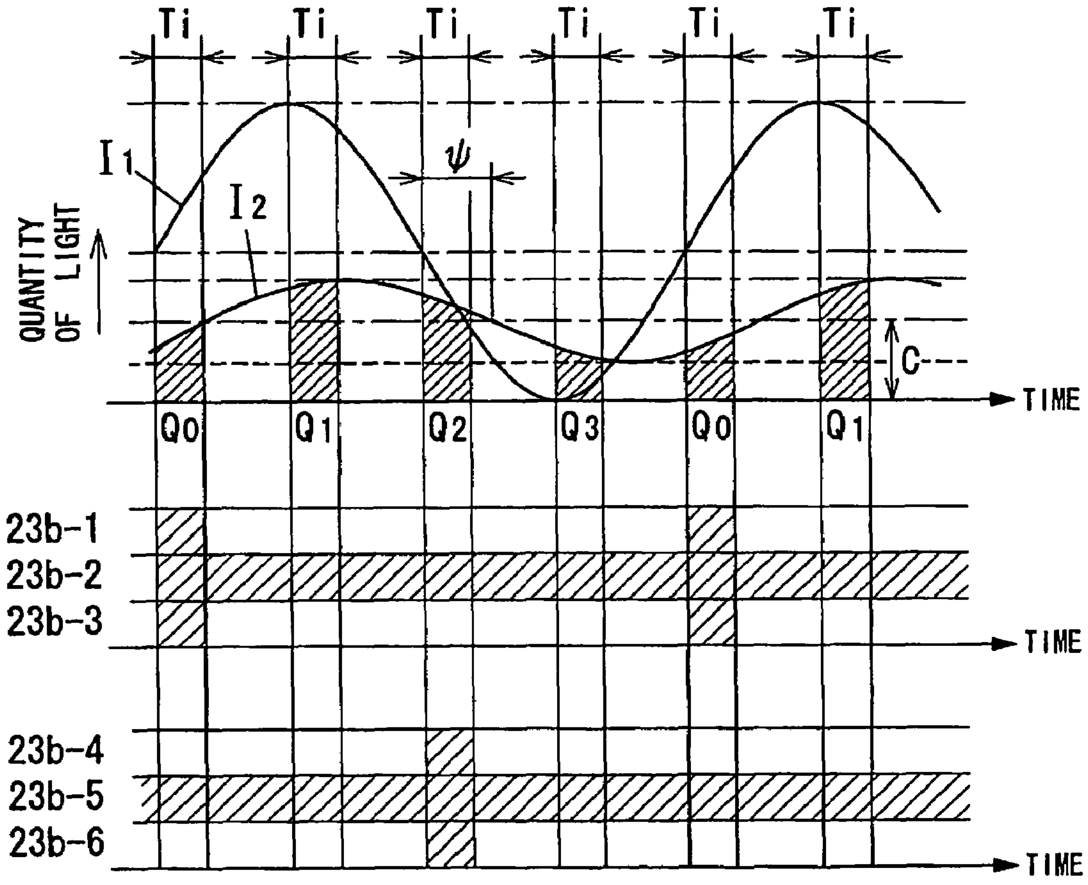
FIG. 6 shows operation of the range image sensor of the second embodiment.

The operation of the second embodiment is now explained. As shown in FIGS. 5 to 7, in the long detection period $T_{L1}$, the voltage +V and the voltage 0V are applied to the control electrodes denoted by 23*b*-1, 23*b*-2, 23*b*-3 and 23*b*-5 and the electrodes denoted by 23*b*-4 and 23*b*-6, respectively during the integration period Ti corresponding to $Q_0$. Then, the voltage +V and the voltage 0V are applied to the electrodes denoted by 23*b*-2, 23*b*-4, 23*b*-5 and 23*b*-6 and the electrodes denoted by 23*b*-1 and 23*b*-3, respectively during the integration period Ti corresponding to $Q_2$. Also, the voltage +V and the voltage 0V are applied to the electrodes denoted by 23*b*-2 and 23*b*-5 and the electrodes denoted by 23*b*-1, 23*b*-3, 23*b*-4 and 23*b*-5, respectively during all (storing period) but the periods. Accordingly, both electric charges corresponding to $Q_0$ and $Q_2$ are generated and integrated at every pixel in synchronization with the period $T_{L1}$.

In a pickup (readout) period $T_{R1}$, the electric charges per pixel corresponding to $Q_0$ and $Q_2$ are transferred from the image pickup region A1 to the storage region A2. Namely, if the electric charge corresponding to $Q_0$ is integrated into the potential well 23*c* corresponding to the electrodes 23*b*-1, 23*b*-2 and 23*b*-3 and then the electric charge corresponding to $Q_2$ is integrated into the potential well 23*c* corresponding to the electrodes 23*b*-4, 23*b*-5 and 23*b*-6, the electric charges corresponding to $Q_0$ and $Q_2$ are picked up to be held at the hold unit corresponding to the long detection period.

After this operation, the current detection period is changed to the short detection period $T_{S1}$, and then operation same as the long detection period $T_{L1}$ is executed. Accordingly, both electric charges corresponding to $Q_0$ and $Q_2$ are generated and integrated at every pixel in synchronization with the period $T_{S1}$. In a pickup period $T_{R2}$ (equal to $T_{R1}$), the electric charges corresponding to $Q_0$ and $Q_2$ are picked up at every pixel to be held at the hold unit corresponding to the short detection period.

After this operation, the current detection period is changed to the long detection period $T_{L2}$ (equal to $T_{L1}$) and also timing for applying each voltage pattern of FIGS. 5A and 5B is shifted 90 degrees, and then operation same as the long detection period $T_{L1}$ is executed. Accordingly, both electric charges corresponding to $Q_1$ and $Q_3$ are generated and integrated at every pixel in synchronization with the period $T_{L2}$. In a pickup period $T_{R3}$ (equal to $T_{R1}$), the electric charges corresponding to $Q_1$ and $Q_3$ are picked up at every pixel to be held at the hold unit corresponding to the long detection period.

After this operation, the current detection period is changed to the short detection period $T_{S2}$ (equal to $T_{S1}$), and then operation same as the long detection period $T_{L2}$ is executed. Accordingly, both electric charges corresponding to $Q_1$ and $Q_3$ are generated and integrated at every pixel in synchronization with the period $T_{S2}$. In a pickup period $T_{R4}$ (equal to $T_{R1}$), the electric charges corresponding to $Q_1$ and $Q_3$ are picked up at every pixel to be held at the hold unit corresponding to the short detection period.

In the second embodiment, it is possible to obtain one set of electric charges corresponding to the long detection period and one set of electric charges corresponding to the short detection period at every operation periods $T_{P1}$ and $T_{P2}$. In this case, if the operation periods $T_{P1}$ and $T_{P2}$ are set to a period of time shorter than 1/60 second, distance images are obtained at 30 frames per second.

In an alternate embodiment, the selection unit of the image construction stage obtains a value of maximum electric charge from each electric charge (digital value) in the hold unit corresponding to the long detection period at every image element in the range image. If the value of maximum electric charge does not exceed a maximum threshold value predetermined based on the saturation level of the light detecting element, the selection unit selects the long detection period as the specific detection period. If the value of maximum electric charge exceeds the maximum threshold value, the selection unit obtains a value of maximum electric charge from each electric charge in the hold unit corresponding to the short detection period. If the value of the maximum electric charge corresponding to the short detection period does not exceed the maximum threshold value, the selection unit selects the short detection period as the specific detection period. Namely, the specific detection period is one of one or more detection periods during which a value of maximum electric charge for each of one set of electric charges held by each hold unit does not exceed the maximum threshold value, and is one detection period during which the value of maximum electric charge becomes maximum of that of the one or more detection periods. The short detection period is set to a period of time during which each value of maximum electric charge does not exceed the maximum threshold value under of the environment to use.

In another alternate embodiment, the selection unit of the image construction stage calculates a mean value with respect to one set of electric charges held by the hold unit corresponding to the long detection period at every image element in the range image. If the mean value does not exceed an average reference value predetermined based on the saturation level of the light detecting element, the selection unit selects the long detection period as the specific detection period. If the mean value exceeds the average reference value, the selection unit calculates a mean value with respect to one set of electric charges held by the hold unit corresponding to the short detection period. If the mean values corresponding to the short detection period does not exceed the average reference value, the selection unit selects the short detection period as the specific detection period. Namely, the specific detection period is one or more detection periods during which a mean value with respect to one set of electric charges held by each hold unit does not exceed the average reference value, and is one detection period during which the mean value becomes maximum of that of the one or more detection periods. Each mean value corresponds to an average with respect to each electric charge in response to the intensity modulated light from the object space and each electric charge in response to the ambient light component. Therefore, it is possible to distinguish whether or not the light detecting element is saturated. Each detection period is preferably set to a period of time during which fluctuation of the ambient light component can be ignored.

Figure 8A:
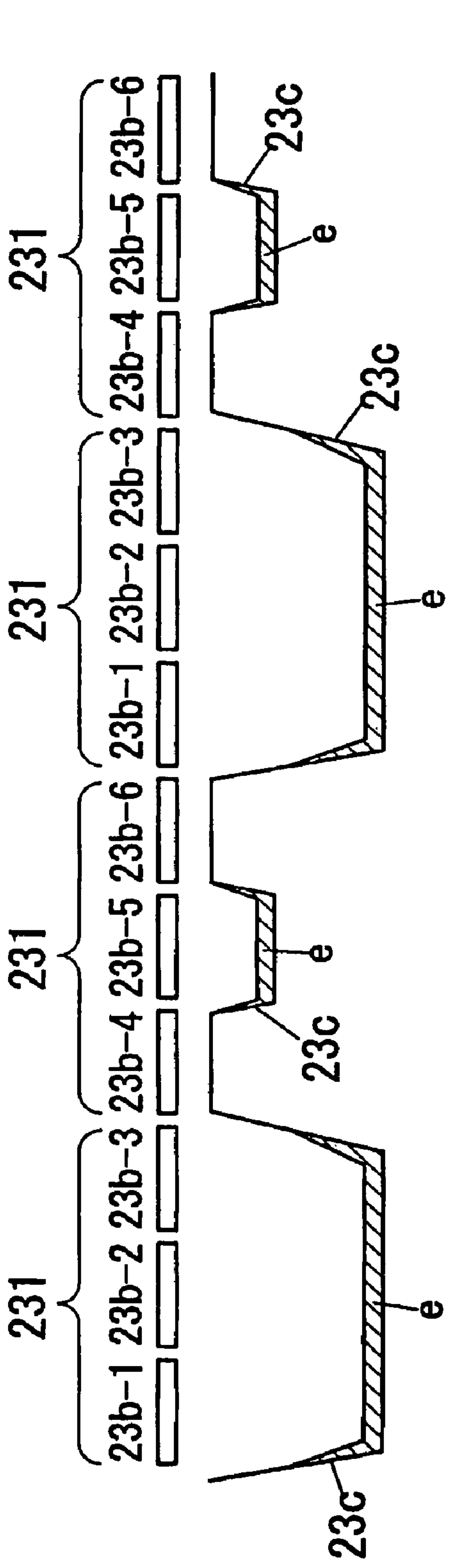
FIG. 8A shows operation of an alternate embodiment.
Figure 8B:
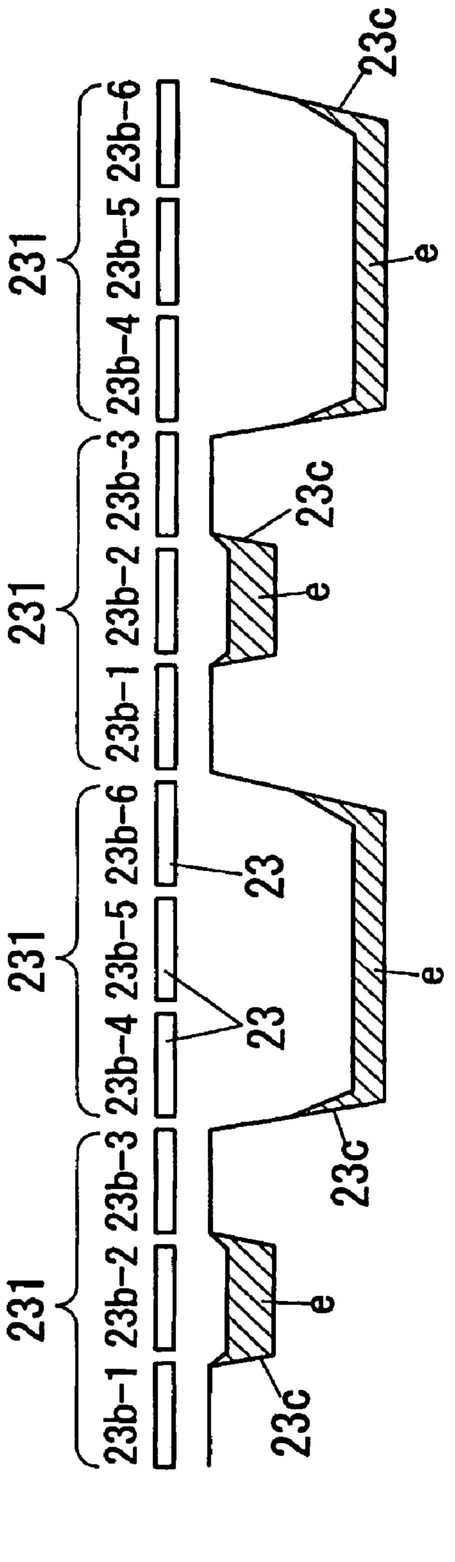
FIG. 8B shows another operation of the alternate embodiment.

In a preferred embodiment, instead of the voltage pattern of FIG. 5A, the sensor control stage as shown as FIG. 8A applies the voltage +V to the control electrodes 23*b*-1, 23*b*-2 and 23*b*-3, applies voltage between +V and 0V to the electrode 23*b*-5 and also applies the voltage 0V to the electrodes 23*b*-4 and 23*b*-6. Also, instead of the voltage pattern of FIG. 5B, the sensor control stage as shown as FIG. 8B applies the voltage between +V and 0V to the electrode 13*b*-2, applies the voltage +V to the control electrodes 23*b*-4, 23*b*-5 and 23*b*-6 and also applies the voltage 0V to the electrodes 23*b*-1 and 23*b*-3. Thus if the potential well from mainly integrating an electric charge is deeper than the potential well for mainly storing an electric charge, an electric charge generated at the region corresponding to each electrode the voltage 0V becomes easy to flow into the deeper potential well. As a result, it is possible to reduce noise component which flows into the potential well for storing an electric charge.

In other alternate embodiment, synchronization with each detection period is continuously executed a plurality of times. In this case, two electric charges picked up in synchronization with each detection period are added up or averaged at every same continuous detection period. For example, the long detection period $T_{L1}$ and the pickup period $T_{R1}$ are continuously executed a plurality of times. The electric charges corresponding to $Q_0$ and $Q_2$ picked up in synchronization with the long detection period $T_{L1}$ are added up or averaged at every continuous detection period $T_{L1}$, respectively. According to this embodiment, since it is possible to comparatively reduce the quantity of light received in each detection period, saturation of the light detection element can be prevented.

In a third embodiment according to the present invention, when the specific detection period is not selected or a first specific detection period as the specific detection period is the short detection period shorter than prescribed length, the image construction stage selects a second specific detection period out of the different detection periods at every two phases of the one set of phases with respect to a specific image element for which the specific detection period is not selected or the short detection period is selected.

In the example of FIG. 7, when a value of each electric charge in the long detection period $T_{L1}$ ($Q_0$, $Q_2$) is smaller than a value (e.g., saturation threshold value) predetermined based on the saturation level of the light detecting element and also a value of each electric charge in the long detection period $T_{L2}$ ($Q_1$, $Q_3$) is larger than the saturation threshold value, the specific detection period is not selected or the short detection is selected. In this case, if a value of each electric charge in the short detection period $T_{S2}$ ($Q_1$, $Q_3$) is smaller than the saturation threshold value, the image construction stage selects the long detection period $T_{L1}$ and the short detection period $T_{S2}$. Namely, the second specific detection period is one of one or more detection periods during which a value obtained from electric charges corresponding to the two phases of the one set of phases does not exceed, for example, the saturation threshold value, and is one detection period during which the value obtained from electric charges becomes maximum of that of the one or more detection periods.

The image construction stage then corrects two values obtained from one set of electric charges picked up with respect to the specific image element in synchronization with the second specific detection period based on a rate of length of the corresponding second specific detection period, and calculates one set of values. In case of the abovementioned example, a value of each electric charge in the short detection period $T_{S2}$ ($Q_1$, $Q_3$) is corrected based on the rate ($T_{L1}/T_{S2}$) of length of the corresponding short specific detection period $T_{S2}$. The relationship between the rate of length and a rate of each electric charge is previously obtained through experimentation.

The image construction stage then calculates a distance value for the specific image element based on the one set of values. Accordingly, there is a possibility of which the distance value can be calculated even when the first specific detection period is not selected. Also, when the short detection period is selected as the first specific detection period it is possible to utilize values of available electric charges obtained during the long detection period in stead of the short detection period. As a result, it is possible to suppress influence of the shot noise to improve the measurement accuracy.

In a fourth embodiment according to the present invention, the image construction stage calculates a comparison value by substituting each value corresponding to one set of electric charges picked up by the sensor control stage for each variable of function with respect to the quantity of light received by each photosensitive unit. The image construction stage then selects the specific detection period by comparing the comparison value with a prescribed threshold value.

For example, the comparison value is a mean value with respect to each electric charge corresponding to each quantity of light received by each photosensitive unit during one or more periods of the specific frequency of the modulation signal, and is calculated by $(Q_0+Q_1+Q_2+Q_3)/4$. The mean value can be also calculated by $(Q_0+Q_2)/2$ or $(Q_1+Q_3)/2$. When the ambient light component as shown in FIGS. 2 and 6 does not change during one or more periods of the specific frequency, the mean value is equivalent to the value C obtained by adding a mean value of intensity $I_2$ to the ambient light component, and is a constant value. Therefore, the specific detection period can be selected based on the mean value. For example, if the mean value is larger than the prescribed threshold value, the short detection period is selected as the specific detection period. Otherwise, the long detection period is selected as the specific detection period. Also, if the mean value is smaller than the lower limit value smaller than the prescribed threshold value, the specific detection period is not selected. Because light from the object space is few and a proper distance value is not obtained.

In a preferred embodiment, the sensor control stage controls to pick up one set of electric charges corresponding to the one set of phases of the modulation signal at every image element in the range image in synchronization with the specific detection period selected by the mean value.

In an alternate embodiment, when there is no ambient light component or ambient light component is known, amplitude A of intensity modulated light with intensity $I_2$ is used as the comparison value. The amplitude A can be calculated from each quantity of light of $Q_0$, $Q_1$, $Q_2$ and $Q_3$ and the following equation.

$$A=(1/2)\cdot\{(Q_0\cdot Q_2)^2+(Q_1\cdot Q_3)^2\}^{1/2}$$

This equation is obtained from $(Q_0\cdot Q_2)^2+(Q_1\cdot Q_3)^2=4A^2\{\sin^2(\Psi)+\cos^2(\Psi)\}=4A^2$. If the amplitude A is larger than a prescribed threshold value, the short detection period is selected as the specific detection period. Otherwise, the long detection period is selected as the specific detection period. Also, if the amplitude A is smaller than a lower limit value smaller than the prescribed threshold value, the specific detection period is not selected since light from the object space is few and a proper distance value is not obtained. When ambient light component is not known, it is possible to distinguish whether or not the light detecting element is saturated by further utilizing the value C.

In another alternate embodiment, a value obtained from the amplitude A and the value C, for example, a value (A/C) obtained by dividing the value C into the amplitude A is used as the comparison value. The value (A/C) corresponds to a ratio of received intensity modulated light to the mean value of the fourth embodiment. If the ratio is high, accuracy of distance value becomes high. Otherwise, accuracy of distance value becomes low. Therefore, if the value (A/C) is larger than a prescribed threshold value, the short detection period is selected as the specific detection period. Otherwise, the long detection period is selected as the specific detection period. Also, if the value (A/C) is smaller than a lower limit value smaller than the prescribed threshold value, the specific detection period is not selected since a distance value of proper accuracy is not obtained. It is possible to distinguish whether or not the light detecting element is saturated by further utilizing the value C.

Figure 9:
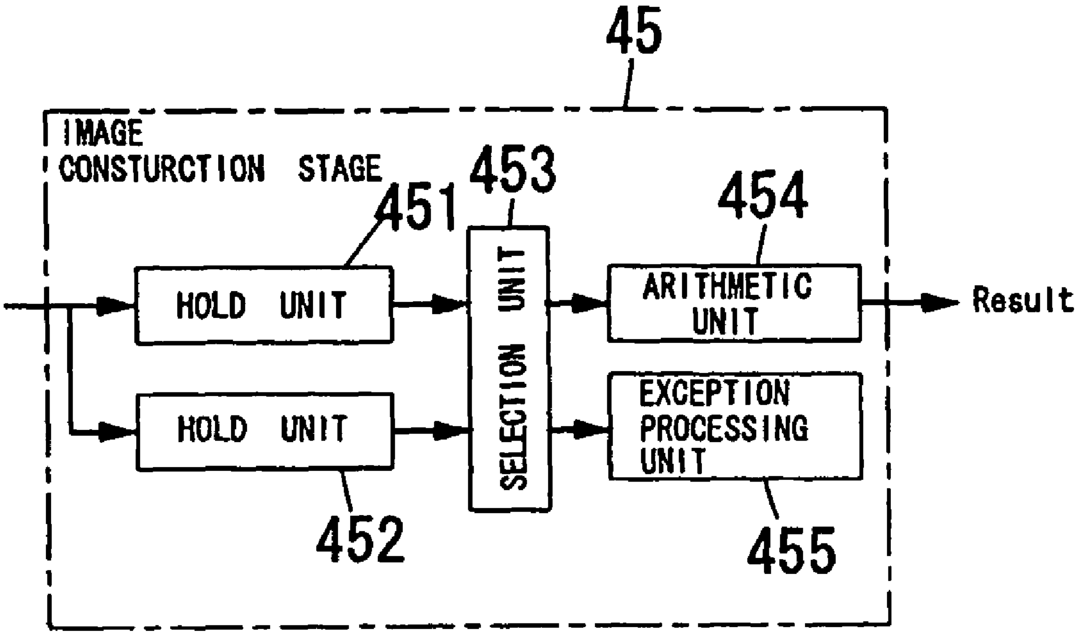
FIG. 9 is a block diagram of an image construction stage in a range image sensor of a fifth embodiment according to the present invention.

FIG. 9 shows an image construction stage 45 in a range image sensor of a fifth embodiment according to the present invention. The image construction stage 45 comprises hold units 451 and 452, a selection unit 453 and a arithmetic unit 454 as well as those of the first embodiment, and further comprises an exception processing unit 455. When a distance value for a specific image element in the range image is not calculated, the unit 455 allocates an alternate value to the specific image element.

For example, when a sum or maximum value of one set of digital values held by the hold unit corresponding to the short detection period is larger than a value predetermined based on the saturation level of the light detecting element or a sum or minimum value of one set of digital values held by the hold unit corresponding to the long detection period is smaller than a lower limit value necessary for calculation of distance value, the specific detection period is not selected for a corresponding image element. The alternate value is a prescribed value such as an average distance value up to the object space or the like. Accordingly, it is possible to construct a range image without lack of distance value.

In an alternate embodiment, the alternate value is a past distance value for the specific image element. A term of validity is related to the past distance value, and the past distance value for the specific image element is used as the alternate value as long as the term does not pass.

In another alternate embodiment, the alternate value is a mean value with respect to a distance value of each image element around the specific image element. Even if the distance value for the specific image element is not calculated, there is a case that a distance value for each image element around the specific image element is calculated. In such case, by using the mean value as the alternate value, a proper distance value with continuity can be allocated to the specific image element. Also, the prescribed value, the past distance value or the mean value may be applied as the alternate value according to the order of priority.

Figure 10:
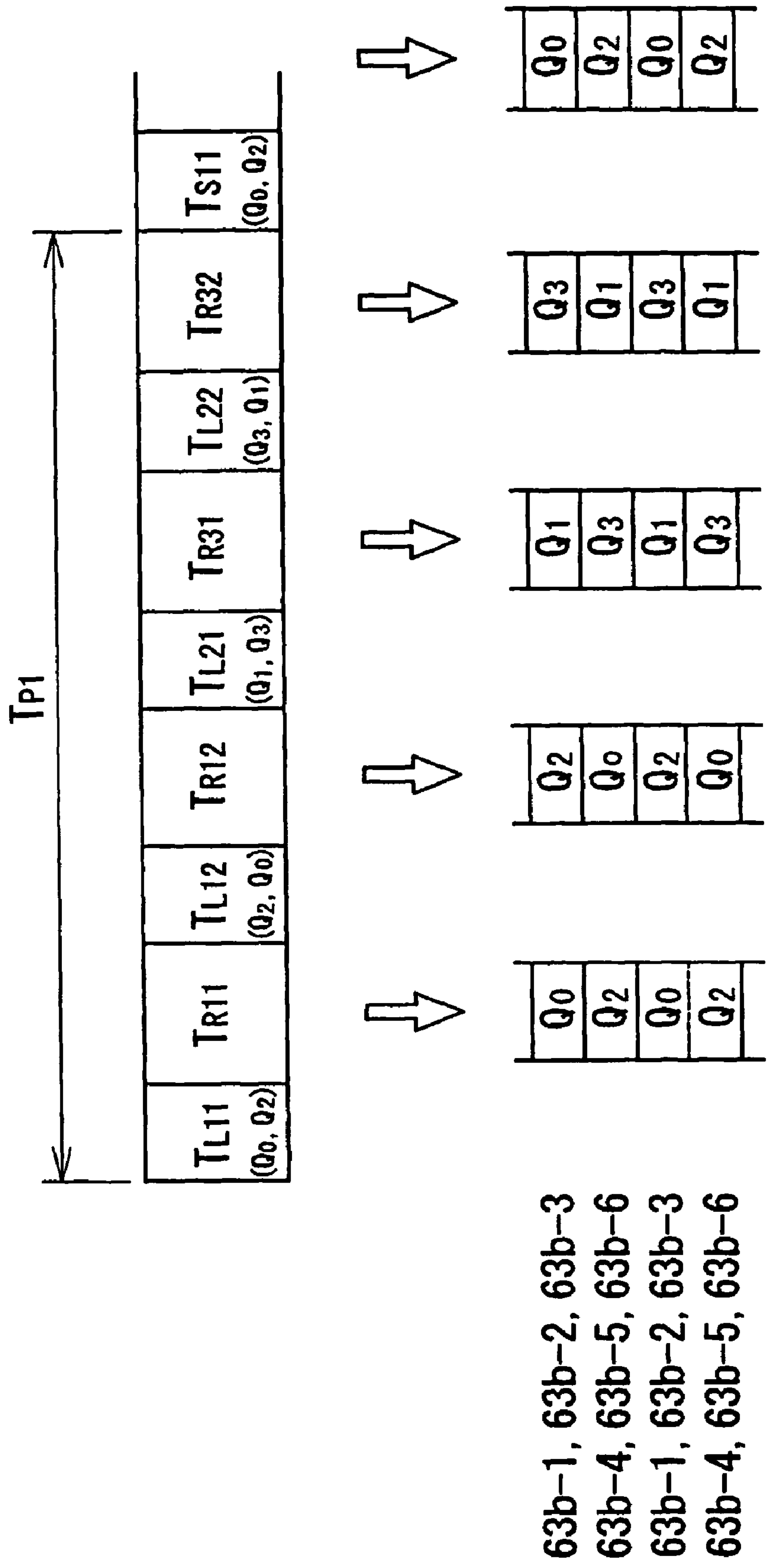
FIG. 10 shows operation of a range image sensor of a sixth embodiment according to the present invention.

FIG. 10 shows operation of a range image sensor of a sixth embodiment according to the present invention. The range image sensor of the sixth embodiment is characterized by a sensor control stage and an image construction stage, and these stages operate to secure reliability of distance value obtained from each pixel consisted of two neighboring photosensitive units.

Photosensitive units in a light detecting element of the sixth embodiment includes pixels each of which is consisted of two neighboring photosensitive units, as well as the second embodiment. Each of the pixels mainly generates and integrates two electric charges at its neighboring photosensitive units in synchronization with two phases of group, respectively. The each group is obtained by dividing the one set of phases of the modification signal into two groups each of which includes two phases. Also, six control electrodes **63*b*-1, 63*b*-2, 63*b*-3, 63*b*-4, 63*b*-5 and 63*b*-6** are provided with respect to each pixel.

Thus, when two photosensitive units are used as one pixel, there is a possibility that an error is included in a distance value obtained from the pixel due to difference of each position of the photosensitive units. For example, when a physical object to be detected in the object space has a step at the part corresponding to the position between the two photosensitive units, the error becomes large and accuracy of the distance value becomes low.

Therefore, the sensor control stage of the sixth embodiment controls to change synchronization timing of each integration period of two neighboring photosensitive units in each pixel with respect to each phase of a corresponding group so as to mutually interchange each phase of the corresponding group with respect to the neighboring photosensitive units. The sensor control stage also controls to pick up each electric charge mainly generated and integrated during each integration period corresponding to each phase of each group at every pixel in synchronization with each of the different detection periods.

In the long detection periods $T_{L11}$ ($Q_0$, $Q_2$) and $T_{L12}$ ($Q_2$, $Q_0$) of FIG. 10, the sensor control stage changes synchronization timing of the integration period of photosensitive unit corresponding to the control electrodes **63*b*-1 to 63*b*-3 in each pixel with respect to the phase corresponding to $Q_0$ of $T_{L11}$ so as to interchange with the phase corresponding to $Q_2$ with respect to the photosensitive unit. The sensor control stage also charges synchronization timing of the integration periods of photosensitive unit corresponding to the electrodes 63_b_-4 to 63_b_-6** in each pixel with respect to the phase corresponding to $Q_2$ of $T_{L11}$ so as to interchange with the phase corresponding to $Q_0$ with respect to the photosensitive unit. In short, synchronization timing of each integration period of two neighboring photosensitive units in each pixel with respect to each phase of a corresponding group is changed so as to mutually interchange each phase of the corresponding group with respect to the neighboring photosensitive units. Besides, the sensor control stage picks up each electric charge mainly generated and integrated during each integration period corresponding to $Q_0$ and $Q_2$ at every pixel in synchronization with the long detection periods $T_{L11}$. Each electric charge is picked up during the pickup period $T_{R11}$. The sensor control stage also picks up each electric charge mainly generated and integrated during each integration period corresponding to $Q_2$ and $Q_0$ at every pixel in synchronization with the long detection periods $T_{L12}$. Each electric charge is picked up during the pickup period $T_{R12}$.

In the long detection periods $T_{L21}$ ($Q_1$, $Q_3$) and $T_{L22}$ ($Q_3$, $Q_1$) of FIG. 10, the sensor control stage changes synchronization timing of the integration period of photosensitive unit corresponding to the control electrodes 63_b_-1 to 63_b_-3 in each pixel with respect to the phase corresponding to $Q_1$ of $T_{L21}$ so as to interchange with the phase corresponding to $Q_3$ with respect to the photosensitive unit. The sensor control stage also changes synchronization timing of the integration period of photosensitive unit corresponding to the electrodes 63_b_-4 to 63_b_-6 in each pixel with respect to the phase corresponding to $Q_3$ of $T_{L21}$ so as to interchange with the phase corresponding to $Q_1$ with respect to the photosensitive unit. Besides, the sensor control stage picks up each electric charge mainly generated and integrated during each integration period corresponding to $Q_1$ and $Q_3$ at every pixel in synchronization with the long detection periods $T_{L21}$. Each electric charge is picked up during the pickup period $T_{R31}$. The sensor control stage also picks up each electric charge mainly generated and integrated during each integration period corresponding to $Q_3$ and $Q_1$ at every pixel in synchronization with the long detection periods $T_{L22}$. Each electric charge is picked up during the pickup period $T_{R32}$.

In the short detection periods corresponding to the long detection periods $T_{L11}$, $T_{L12}$, $T_{L21}$ and $T_{L22}$, the sensor control stage executes the same process as that in the long detection periods.

The image construction stage of the sixth embodiment combines each electric charge picked up at every pixel by the sensor control stage with one set of electric charges corresponding to the one set of phases of the modulation signal. The image construction stage then calculates a distance value for each pixel based on the one set of electric charges. For example, a value of electric charge corresponding to $Q_0$, $Q_1$, $Q_2$ or $Q_3$ is combined with the value of corresponding electric charge in one set of electric charges as a sum or mean value. In this case, the operation period $T_{P1}$ corresponds to one frame of the range image.

Thus, since each phase of each group is mutually interchanged with respect to each neighboring photosensitive units, it is possible to secure reliability of distance value obtained from each pixel consisted of two neighboring photosensitive units.

In an alternate embodiment, the image construction stage calculates one set of integrating electric charges at every image element in the range image and calculates a distance value for each image element in the range image based on each one set of integrating electric charges. The one set of integrating electric charges is obtained that each electric charge in a plurality of detection periods (e.g., specific detection periods) is added up at every same phase of the one set of phases. In this embodiment, since it is possible to comparatively reduce the quantity of light received in each specific detection period, saturation of the light detecting element can be prevented.

In another alternate embodiment, a plurality of neighboring photosensitive units are set as a unit of arithmetic. The sensor control stage changes an integration period of each photosensitive unit of the unit of arithmetic to an integration period of a different phase of the one set of phases at every specific detection period. The image construction stage makes a value of an image element in the range image out of distance found by using an electric charge added up a period of time in which each photosensitive unit receives light from the object space. The light is received same number of times each in all integration periods of the phase. In this embodiment, when a different photosensitive unit receives light during an integration period in synchronization with a different phase of the modulation signal in a specific detection period, position information of the plurality of photosensitive units of the unit of arithmetic is not included in an electric charge added up in order to find the distance. Therefore, reliability of the obtained distance becomes high.

Although the present invention has been described with reference to certain preferred embodiments, numerous modifications and variations can be made by those skilled in the art without departing from the true spirit and scope of this invention.

For example, in stead of the similar construction to the CCD image sensor of FT type, it is possible to use similar construction to that of interline transfer (IT) or frame interline transfer (FIT) type.

The invention claimed is:

1. A range image sensor, comprising:

a light source which emits intensity modulated light toward an object space according to a modulation signal of a specific frequency;

a light detecting element with photosensitive units disposed to face said object space, each of the photosensitive units receiving light from said object space during an integration period shorter than one period of said specific frequency, and generating an electric charge in response to a quantity of light from the space;

a sensor control stage which controls to synchronize each integration period of said photosensitive units with a specific phase of said modulation signal, and pick up each electric charge generated and integrated in said light detecting element from the light detecting element after a detection period corresponding to one or more periods of said specific frequency; and an image construction stage which calculates a distance value for each image element in a range image based on each electric charge picked up by said sensor control stage to construct the range image, said distance value representing, when at least a physical object is in said object space, distance up to the physical object;

wherein: said detection period includes different detection periods; and said image construction stage calculates a distance value for each image element in said range image based on each electric charge picked up after a specific detection period of said different detection periods by said sensor control stage, said specific detection period being one of one or more detection periods during which said light detecting element does not reach saturation, and being one detection period during which a value related to the quantity of light received from said object space becomes maximum of that of the one or more detection periods;

wherein: said sensor control stage changes each integration period of neighboring photosensitive units to an integration period corresponding to a different phase of each specific phase every specific detection period, said neighboring photosensitive units corresponding to each image element in said range image; and said image construction stage calculates a distance value from each electric charge obtained by integrating each electric charge specific detection periods every integration period corresponding to said each specific phase when calculating a distance value for each image element in said range image.

2. The range image sensor of claim 1, wherein:

said sensor control stage controls to synchronize each integration period of said photosensitive units with each of a set of phases different from each other in said modulation signal, and pick up one set of electric charges corresponding to the one set of phases at every image element in said range image after at least said specific detection period of said different detection periods; and said image construction stage calculates a distance value for each image element in said range image based on one set of electric charges picked up at every image element in said range image after said specific detection period.

3. The range image sensor of claim 2, wherein:

said sensor control stage controls to pick up one set of electric charges corresponding to said one set of phases at every image element in said range image after each of said different detection periods; and said image construction stage selects said specific detection period out of said different detection periods, and calculates a distance value for each image element in said range image based on one set of electric charges picked up at every image element in said range image after the specific detection period, said specific detection period being one of one or more detection periods during which a value obtained from one set of electric charges picked up at every image element in said range image after each of said different detection periods does not exceed a value predetermined based on saturation level of said light detecting element, and being one detection period during which the value obtained from one set of electric charges becomes maximum of that of the one or more detection periods.

4. The range image sensor of claim 3, wherein, when said specific detection period is not selected or a first specific detection period as said specific detection period is shorter than prescribed length, said image construction stage:

(i) selects a second specific detection period out of said different detection periods at every one or more phases of said one set of phases, with respect to a specific image element for which said specific detection period is not selected or the first specific detection period shorter than said prescribed length is selected;

(ii) corrects one or more values obtained from one set of electric charges picked up with respect to the specific image element after the second specific detection period based on a rate of length of the corresponding second specific detection period, and calculates one set of values; and (iii) calculates a distance value for the specific image element based on the one set of values;

said second specific detection period being one of one or more detection periods during which a value obtained from electric charge corresponding to the one or more phases of said one set of phases does not exceed a value predetermined based on said saturation level, and being one detection period during which the value obtained from electric charge becomes maximum of that of the one or more detection periods.

5. The range image sensor of claim 2, wherein said specific detection period is one of one or more detection periods during which a value of one set of electric charges picked up at every image element in said range image after each of said different detection periods does not exceed a prescribed value corresponding to said saturation level, and is one detection period during which the value of one set of electric charges becomes maximum of that of the one or more detection periods.

6. The range image sensor of claim 2, wherein said specific detection period is one of one or more detection periods during which a value of maximum electric charge for each of one set of electric charges picked up at every image element in said range image after each of said different detection periods does not exceed a maximum threshold value predetermined based on said saturation level, and is one detection period during which the value of maximum electric charge becomes maximum of that of the one or more detection periods.

7. The range image sensor of claim 2, wherein said specific detection period is one of one or more detection periods during which a mean value with respect to one set of electric charges picked up at every image element in said range image after each of said different detection periods does not exceed an average reference value predetermined based on said saturation level, and is one detection period during which the mean value becomes maximum of that of the one or more detection periods.

8. The range image sensor of claim 2, wherein said image construction stage calculates a comparison value by applying at least a value obtained from one set of electric charges picked up by said sensor control stage to a function with respect to the quantity of light received by each of said photosensitive units, and selects said specific detection period by comparing the comparison value with a prescribed threshold value.

9. The range image sensor of claim 2, wherein said image construction stage calculates one set of integrating electric charges at every image element in said range image and calculates a distance value for each image element in said range image based on each one set of integrating electric charges, said one set of integrating electric charges being obtained that each electric charge in a plurality of the specific detection periods is added up at every same phase of said one set of phases.

10. The range image sensor of claim 9, wherein:

said light detecting element includes pixels each of which is consisted of two or more neighboring photosensitive units in said photosensitive units, each of the pixels mainly generating and integrating two or more electric charges at its two or more neighboring photosensitive units in synchronization with two or more phases of each group obtained by dividing said one set of phases into groups each of which includes two or more phases, respectively;

said sensor control stage controls to change synchronization timing of each integration period of two or more neighboring photosensitive units in each of said pixels with respect to each phase of a corresponding group of said groups so as to mutually interchange each phase of the corresponding group with respect to the neighboring photosensitive units, and pick up each electric charge mainly generated and integrated during each integration period corresponding to each phase of said each group at every pixel after at least said specific detection period of said different detection periods; and said image construction stage combines each electric charge picked up at every pixel by said sensor control stage with one set of electric charges corresponding to said one set of phases, and calculates a distance value for each image element in said range image based on the one set of electric charges.

11. The range image sensor of claim 9, wherein:

a plurality of neighboring photosensitive units are set as a unit of arithmetic;

said sensor control stage changes an integration period of each photosensitive unit of the unit of arithmetic to an integration period of a different phase of said one set of phases at every said specific detection period; and said image construction stage makes a value of an image element in said range image out of distance found by using an electric charge added to a period of time in which each photosensitive unit receives light from said object space, said light being received same number of times each in all integration periods of said phase.

12. The range image sensor of claim 1, wherein said comparison value is a mean value with respect to an electric charge corresponding to a quantity of light received by said photosensitive units during one or plural periods of said specific frequency.

13. The range image sensor of claim 1, wherein, when a distance value for a specific image element in said range image is not calculated, said image construction stage allocates an alternate value to the specific image element.

14. The range image sensor of claim 13, wherein said alternate value is a past distance value for said specific image element.

15. The range image sensor of claim 13, wherein said alternate value is a mean value with respect to a distance value of each image element around said specific image element.

* * * * *